(12) United States Patent
Hayashi

(10) Patent No.: US 7,915,823 B2
(45) Date of Patent: Mar. 29, 2011

(54) ORGANIC ELECTROLUMINESCENT DEVICE WITH SURFACE-MODIFYING LAYER, METHOD FOR MANUFACTURING THE SAME, AND ELECTRONIC APPARATUS INCLUDING THE SAME

(75) Inventor: Kenji Hayashi, Okaya (JP)

(73) Assignee: Seiko Epson Corporation, Tokyo (JP)

( * ) Notice: Subject to any disclaimer, the term of this patent is extended or adjusted under 35 U.S.C. 154(b) by 433 days.

(21) Appl. No.: 12/171,968

(22) Filed: Jul. 11, 2008

(65) Prior Publication Data
US 2009/0051274 A1 Feb. 26, 2009

(30) Foreign Application Priority Data

Aug. 20, 2007 (JP) ................... 2007-213366

(51) Int. Cl.
*H01J 1/62* (2006.01)
*H01J 63/04* (2006.01)
(52) U.S. Cl. ............................ 313/512; 313/504; 445/25
(58) Field of Classification Search ................... 313/504, 313/512; 445/25
See application file for complete search history.

(56) References Cited

U.S. PATENT DOCUMENTS

| | | | | |
|---|---|---|---|---|
| 2004/0232833 A1* | 11/2004 | Menda et al. | ................. | 313/512 |
| 2005/0007015 A1* | 1/2005 | Yokoyama et al. | ........... | 313/506 |
| 2005/0023523 A1* | 2/2005 | Kawaguchi et al. | ............. | 257/40 |
| 2005/0077816 A1* | 4/2005 | Yamada et al. | ................ | 313/503 |
| 2006/0088951 A1* | 4/2006 | Hayashi et al. | ................. | 438/99 |
| 2006/0158108 A1* | 7/2006 | Hayashi | ........................ | 313/506 |
| 2007/0063645 A1* | 3/2007 | Yokoyama | .................... | 313/506 |
| 2007/0066178 A1* | 3/2007 | Yamada et al. | ................. | 445/24 |
| 2007/0194303 A1* | 8/2007 | Harada et al. | ................... | 257/40 |

FOREIGN PATENT DOCUMENTS

| JP | A 2001-230086 | 8/2001 |
|---|---|---|
| JP | A 2006-332019 | 12/2006 |

* cited by examiner

*Primary Examiner* — Nimeshkumar D Patel
*Assistant Examiner* — Glenn Zimmerman
(74) *Attorney, Agent, or Firm* — Oliff & Berridge, PLC

(57) ABSTRACT

An organic electroluminescent device includes an element substrate including a plurality of light-emitting elements, each including a pair of electrodes with an organic luminescent layer therebetween, and a coating layer covering the light-emitting elements. A sealing substrate is opposed to the element substrate. The sealing substrate includes a plurality of color layers and a light-shielding layer separating the color layers from each other. An outer region sealing layer bonds the outer region of the sealing substrate to the outer region of the element substrate. A filling layer is surrounded by the outer region sealing layer, and bonds the sealing substrate and the element substrate together in the region in which the light-emitting elements and the color layers are arranged. The color layers and the light-shielding layer of the sealing substrate are covered with a surface-modifying layer made of a material having a higher surface energy to the material of the filling layer than the surface energy to the surfaces of the color layers and light-shielding layer.

10 Claims, 7 Drawing Sheets

ORGANIC ELECTROLUMINESCENT DEVICE WITH SURFACE-MODIFYING LAYER, METHOD FOR MANUFACTURING THE SAME, AND ELECTRONIC APPARATUS INCLUDING THE SAME

BACKGROUND

1. Technical Field

The present invention relates to an organic electroluminescent device, a method for manufacturing the same, and an electronic apparatus including the same.

2. Related Art

As information apparatuses are being diversified, lightweight, planar, power-saving display devices are increasingly desired. Among those are organic electroluminescent devices (hereinafter referred to as organic EL devices) having an organic luminescent layer.

The organic EL device includes a luminescent layer, a hole injection layer, and an electron injection layer. Many of the materials of these layers easily react with water in the air and thus easily deteriorate. If these layers deteriorate, a so-called "dark spot", where light is not emitted, occurs in the organic EL device and is a cause of a short-life light-emitting element. In order to prevent water or oxygen from permeating the light emitting elements, a structure has been proposed in which the light-emitting elements are sealed with a highly moisture-resistant thin film (for example, Japanese Unexamined Patent Application Publication No. 2001-230086).

The organic EL device generally includes an element substrate and a sealing substrate that are bonded together with an adhesive layer in between. Unfortunately, air bubbles are trapped in a step or an uneven portion on the surfaces of the color layers or the light-shielding layer when the adhesive layer is formed. In order to solve this problem, it is proposed that an overcoat layer is provided on the surfaces of the color layers and the light-shielding layer to alleviate the step or the unevenness for even surfaces. The overcoat layer is made of a non-water absorbable material from the viewpoint of preventing the color layers and the light-shielding layer from being degraded by water. Unfortunately, non-water absorbable overcoat layers are generally not wettable to the liquid material of the adhesive layer. If the overcoat is less wettable to the liquid material of the adhesive layer, the liquid material of the adhesive layer cannot easily fill a desired space and it takes a long time to fill the space.

The overcoat layer disposed between the two substrates increases the distance between the organic luminescent layers and the color layers. In a top emission organic EL device, a large distance between the organic luminescent layers and the color layers requires that the area of the light-shielding layer is increased to prevent light from leaking to the adjacent pixels. Consequently, the aperture area of the color layers is reduced, and the extraction efficiency of emitted light is degraded accordingly.

SUMMARY

An advantage of the invention is that it provides an organic electroluminescent device including light-emitting elements prevented from deteriorating, and from which light can be efficiently extracted to ensure a fine pixel pitch and a wide viewing angle, and also provides a method for manufacturing the organic electroluminescent device and an electronic apparatus including the organic electroluminescent device.

According to an aspect of the invention, an organic electroluminescent device is provided. The organic electroluminescent device includes an element substrate including a plurality of light-emitting elements, each including a pair of electrodes with an organic luminescent layer therebetween, and a coating layer covering the light-emitting elements. A sealing substrate is opposed to the element substrate. The sealing substrate includes a plurality of color layers and a light-shielding layer separating the color layers from each other. The outer regions of the sealing substrate and the element substrate are bonded together with an outer region sealing layer therebetween. A filling layer is surrounded by the outer region sealing layer. The filling layer bonds the sealing substrate and the element substrate together in the region in which the light-emitting elements and the color layers are arranged. In this structure, the color layers and the light-shielding layer of the sealing substrate are covered with a surface-modifying layer made of a material having a higher surface energy to the material of the filling layer than the surface energy to the surfaces of the color layers and light-shielding layer.

In the organic electroluminescent device, the surfaces of the color layers and the light-shielding layer are covered with the surface-modifying layer improving the surface energy to the material of the filling layer. The surface-modifying layer acts as the contact surface with the liquid material of the filling layer to reduce their contact angle. Thus, the material of the filling layer can easily fill the desired space, and is prevented from trapping air bubbles. Accordingly, an overcoat layer, which is formed to planarize the surfaces of the color layers and the light-shielding layer, is not required. Consequently, the distance between the light-emitting elements and the color layers is reduced, so that emitted light does not leak to the adjacent pixels even if in order to increase the viewing angle, the pitch of the pixels is reduced while the area of the color layers (area of pixels) is increased. Since the emitting area is thus increased, highly bright light can be emitted with low power consumption. Also, the capability of the filling layer material to fill the desired space is enhanced. Consequently, a reduced amount of the filling layer material can sufficiently fill the desired space in a shorter time.

Preferably, the surface-modifying layer has a smaller thickness than the color layers and the light-shielding layer.

Thus, the absorption of water is reduced to ensure a desired strength. If the surface-modifying layer has a large thickness, the surface-modifying layer may absorb the curing agent contained in the materials of the outer region sealing layer and the filling layer to hinder the materials from being cured. By reducing the thickness of the surface-modifying layer to smaller than that of the color layers and the light-shielding layer, the absorption of the curing agent can be reduced. Accordingly, the outer region sealing layer and the filling layer can be favorably cured, and thus, their adhesion performance can be ensured. A thick surface-modifying layer increases the distance between the organic luminescent layers and the color layers, thus losing the advantage in eliminating the overcoat layer.

Preferably, the filling layer is made of a material having a lower viscosity than the material of the outer region sealing layer.

Since the material of the outer region sealing layer has a higher viscosity than the material of the filling layer, the outer region sealing layer is prevented from being fractured or broken when the substrates are bonded together. Thus, the outer region sealing layer sufficiently fulfils the function as a bank preventing the filling layer from extending to the outer region, and besides prevents water from permeating the inside surrounded by the outer region sealing layer between the element substrate and the sealing substrate. Furthermore, the outer region sealing layer secures the sealing substrate overlying the coating layer, and buffers external mechanical impact, thus protecting the coating layer.

Preferably, the surface-modifying layer is patterned so as to expose an outer region of the sealing substrate.

The surface-modifying layer thus formed allows the material of the outer region sealing layer to be applied to a desired area, preventing the material from extending to the outer region. Thus, the outer region sealing layer is formed to a predetermined thickness on the sealing substrate in the outer region. Thus, the outer region sealing layer acts as a bank without being broken.

Preferably, light-shielding layer is also provided in an outer region of the sealing substrate from which light is not emitted, and the surface-modifying layer is patterned so as to expose part of the region of the light-shielding layer in contact with the outer region sealing layer.

Thus, the outer region sealing layer formed on the light-shielding layer functions as a bank without being broken.

Preferably, the coating layer includes an electrode protection layer covering the electrodes of the light-emitting elements, an organic buffer layer covering the electrode protection layer, and a gas barrier layer covering the organic buffer layer, and the light-shielding layer is made of a material having a lower elastic modulus than the elastic moduli of the organic buffer layer and the gas barrier layer.

Since in this structure, the coating layer having a multilayer structure including at least three layers of the electrode protection layer covering the electrodes of the light-emitting elements, the organic buffer layer covering the electrode protection layer, and the gas barrier layer covering the organic buffer layer is formed between the element substrate and the sealing substrate, the surface of the element substrate having the light-emitting elements can be planarized, and water can be prevented from permeating the light-emitting elements.

Since the light-shielding layer is made of a material having a lower elastic modulus than the elastic moduli of the organic buffer layer and the gas barrier layer, the load placed when the substrates are bonded can be absorbed to prevent the gas barrier layer from being damaged.

According to another aspect of the invention, a method for manufacturing the organic electroluminescent device is provided. The method includes: forming a surface-modifying layer covering a plurality of color layers and a light-shielding layer on a sealing substrate; forming a coating layer covering a plurality of light-emitting elements over an element substrate, each light-emitting element including an organic luminescent layer between a pair of electrodes; and bonding the element substrate and the sealing substrate together with an outer region sealing layer and a filling layer therebetween. The surface-modifying layer has a higher surface energy to the material of the filling layer than the surface energy to the surfaces of the color layers and the light-shielding layer.

In the method of the invention, the surface-modifying layer is formed over the surfaces of the color layers and the light-shielding layer to improve the surface energy to the liquid material of the filling layer. Thus, the surface-modifying layer acts as the contact surface with the material of the filling layer to reduce their contact angle. Consequently, the capability of the filling layer material to fill the desired space is enhanced, and a reduced amount of the filling layer material can sufficiently fill the desired space in a shorter time without trapping air bubbles.

Preferably, bonding the element substrate and the sealing substrate together includes: forming the outer region sealing layer by applying a UV-curable resin to an outer region of the sealing substrate; and forming the filling layer by applying a thermosetting resin inside the outer region sealing layer.

The outer region sealing layer thus formed can prevent the material (thermosetting resin) of the filling layer from extending to the outer region. The outer region sealing layer is formed of a UV-curable resin. By further increasing the viscosity of the UV-curable resin by UV light exposure before bonding the element substrate and the sealing substrate together, the outer region sealing layer can be prevented from breaking when the substrates are bonded. By forming the filling layer of a thermosetting resin inside the outer region sealing layer between the element substrate and the sealing substrate, the adhesion between the element substrate and the sealing substrate can be enhanced while the stress is reduced. In addition, water can be prevented from permeating the inside surrounded by the outer region sealing layer between the element substrate and the sealing substrate. Furthermore, the filling layer secures the sealing substrate overlying the coating layer and buffers external mechanical impact, thus protecting the coating layer.

Preferably, the element substrate and the sealing substrate are bonded together under reduced pressured after the UV-curable resin of the outer region sealing layer starts a curing reaction.

The material of the UV-curable resin of the outer region sealing layer is exposed to ultraviolet light to induce a curing reaction before bonding the element substrate and the sealing substrate together. When the viscosity of the outer region sealing layer starts increasing gradually, the element substrate and the sealing substrate are bonded together. Since the viscosity of the outer region sealing layer is thus increased at the point of bonding the substrates, the bonding positions can be aligned accurately and the filling layer can be prevented from extending to the outer region.

Since the element substrate and the sealing substrate are bonded together under reduced pressure and the adhesive layers are cured in a normal atmosphere, the material of the filling layer can spread over inside the outer region sealing layer without forming a void, thus preventing air bubbles or water from being trapped.

According to another aspect of the invention, an electronic apparatus including the organic electroluminescent device is provided.

The electronic apparatus has a highly reliable, high-quality display.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
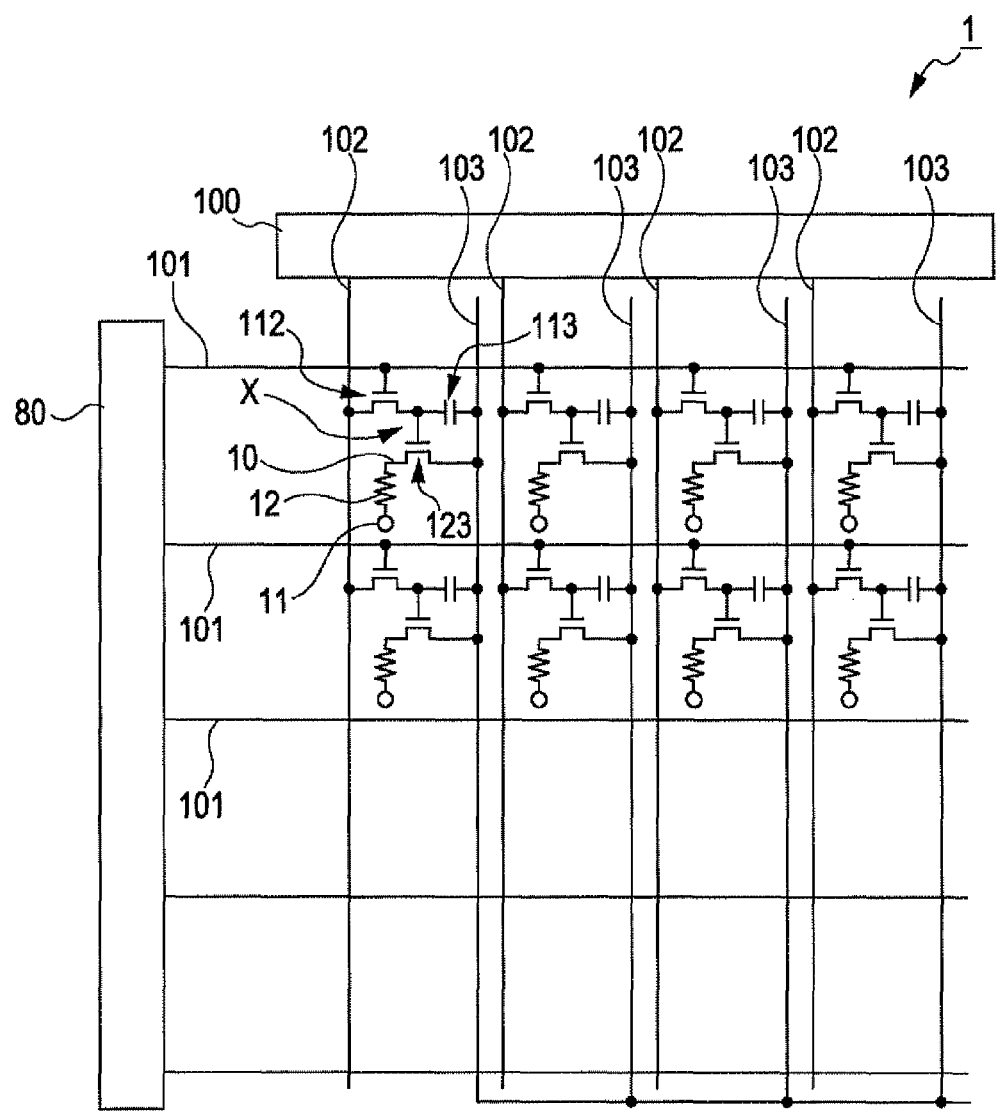
FIG. 1 is a schematic diagram of the wiring structure of an organic EL device according to an embodiment of the invention.

The invention will be further described in detail. The following embodiments will describe part of the invention, and are not intended to limit the invention. It will be readily appreciated by those skilled in the art that various modifications in form and detail may be made without departing from the scope and spirit of the invention. The scales of the layers, members, and the like illustrated in the drawings are varied to be visually recognized.

First Embodiment of Organic EL Device

An organic electroluminescent device (hereinafter referred to as organic EL device) will first be described according to a first embodiment of the invention.

FIG. 1 is a schematic representation of the wiring structure of an organic EL device 1 according to the first embodiment.

The organic EL device 1 is of active matrix type using thin-film transistors (hereinafter referred to as TFTs) as switching elements. In the organic EL device 1, the wiring is constituted of a plurality of scanning lines 101, a plurality of signal lines 102 extending perpendicular to the scanning lines 101, and a plurality of power lines 103 extending parallel to the signal lines 102. Pixel regions X are formed in the vicinities of the respective intersections of the scanning lines 101 and the signal lines 102.

The organic EL device may not be of active matrix type using TFTs, and may be of matrix type using a simple element substrate. Such a matrix-driven organic EL device can produce the same effect at a low cost.

The signal lines 102 are connected to a data line driving circuit 100 including a shift resistor, a level shifter, a video line, and an analog switch. The scanning lines 101 are connected to a scanning line driving circuit 80 including a shift resistor and a level shifter.

Each pixel region X includes a switching TFT (switching element) 112 having a gate electrode to which scanning signals are supplied through the corresponding scanning line 101, a hold capacitor 113 holding a pixel signal transmitted from the corresponding signal line 102 through the switching TFT 112, a driving TFT (switching element) 123 having a gate electrode to which the pixel signal held by the hold capacitor 113 is transmitted, a anode 10 (electrode) to which a driving current flows from the power line 103 when electrically connected to the power line 103 through the driving TFT 123, and a luminescent layer 12 (organic luminescent layer) disposed between the anode 10 and a cathode 11 (electrode).

In the organic EL device 1, when the scanning line 101 is operated to turn on the switching TFT 112, the hold capacitor 113 holds the potential of the signal line 102 at that time and the on/off state of the driving TFT 123 is determined depending on the state of the hold capacitor 113. Then, a current flows to the anode 10 from the power line 103 through the channel of the driving TFT 123 and further to the cathode 11 through the luminescent layer 12. The luminescent layer 12 emits light according to the amount of the current.

Figure 2:
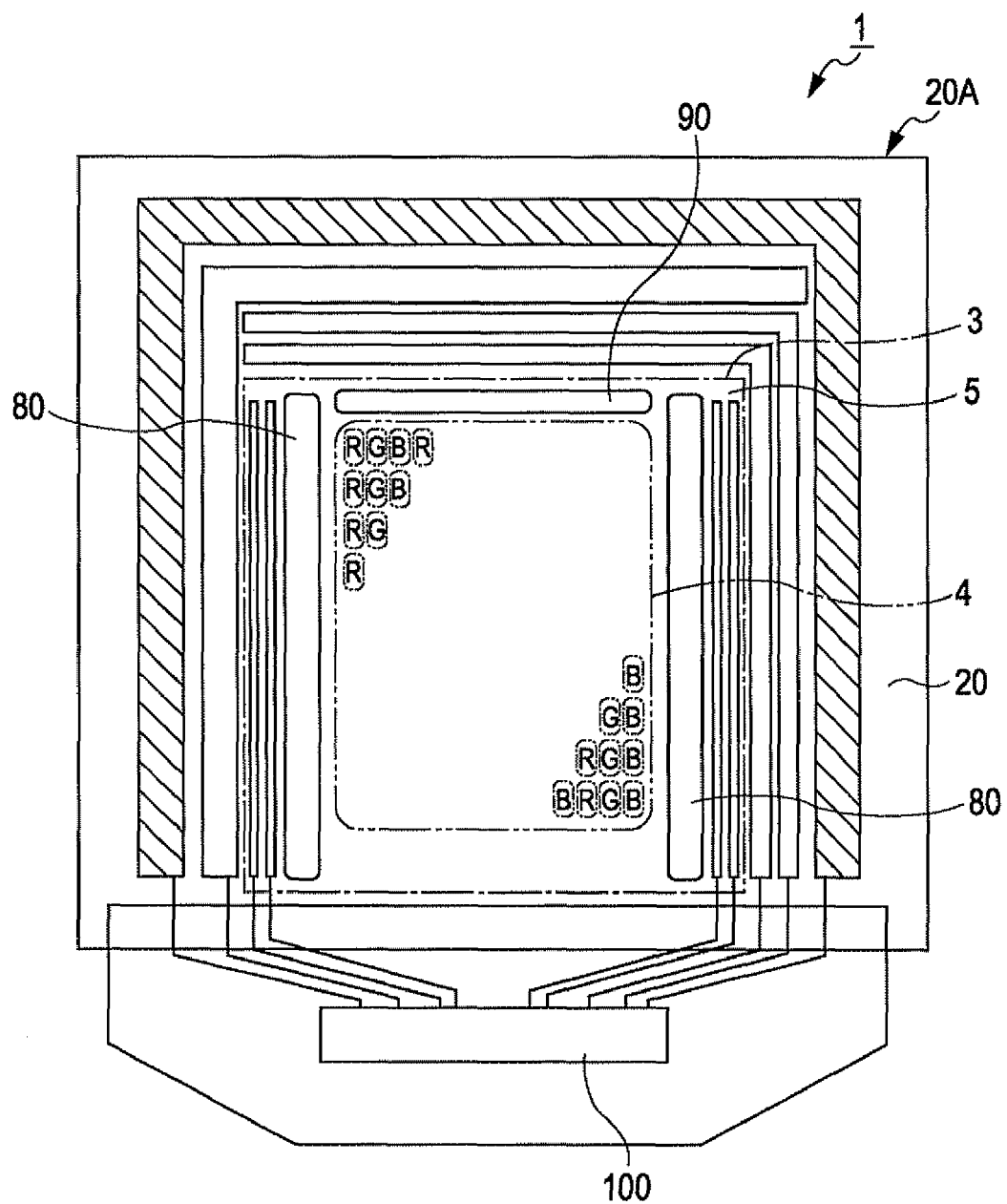
FIG. 2 is a schematic plan view of an organic EL device according to a first embodiment of the invention.
Figure 3:
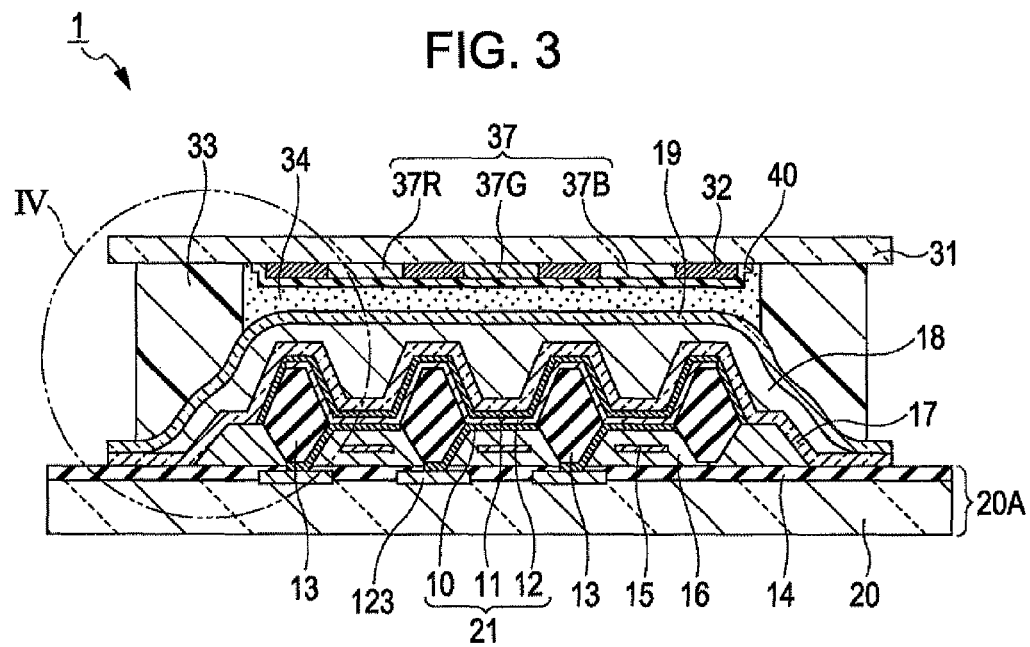
FIG. 3 is a schematic sectional view of the organic EL device according to the first embodiment of the invention.
Figure 4:
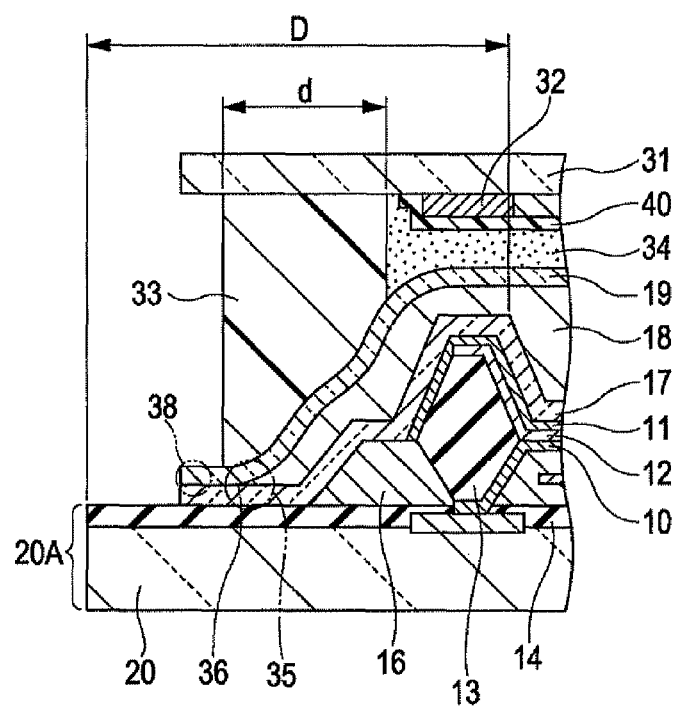
FIG. 4 is a fragmentary enlarged sectional view of the portion surrounded by circle IV shown in FIG. 3.

The organic EL device 1 of the first embodiment will now be described in detail with reference to FIGS. 2 to 4. FIG. 2 is a schematic plan vies of the organic EL device 1. FIG. 3 is a schematic sectional view of the organic EL device 1, and FIG. 4 is an enlarged sectional view of the outer region of the organic EL device 1, showing the portion surrounded by circle IV in FIG. 3.

First, the structure of the organic EL device 1 will be described with reference to FIG. 2.

FIG. 2 shows a TFT element substrate (hereinafter referred to as the element substrate) 20A in which the luminescent layers 12 emit light with the above described lines, TFTs and circuits disposed on a base substrate 20.

The element substrate 20A of the organic EL device 1 includes an effective display region 4 (surrounded by the chain double-dashed line in FIG. 2) in the middle portion and a dummy region 5 (between the chain line and the chain double-dashed line in FIG. 2) surrounding the effective display region 4.

The pixel regions X shown in FIG. 1, each of which emits any one of red (R), green (G) and blue (B) light, define display regions R, G and B shown in FIG. 2. In the effective display region 4, the display regions X, C, and B are arrayed in a matrix manner such that the same color display regions are aligned in the vertical direction in the figure, that is, in a striped manner. A set of an X, G and B display regions defines a picture element. The picture element mixes F, G and B light to display full color images.

The scanning line driving circuit 80 is disposed at both side of the effective display region 4 in FIG. 2, under the dummy region 5. A test circuit 90 is disposed above the effective display region 4 in FIG. 2 under the dummy region 5. The test circuit 90 is intended to test the operation of the organic EL device 1, and includes, for example, a test data output unit (not shown) that transmits test results to the outside. Thus, the organic EL device 1 is investigated for quality and defects during manufacture and before shipping.

Sectional Structure

The sectional structure of the organic EL device 1 will now be described with reference to FIG. 3.

The organic EL device 1 of the first embodiment has a so-called top emission structure. Since the top emission structure emits light through the sealing substrate, but not through the element substrate, a wide light emission area can be ensured without being affected by the sizes of the circuits disposed in the element substrate. Thus, the top emission structure can ensure a high brightness while the voltage and current are reduced, thus keeping the lifetime of the light-emitting element long.

The organic EL device 1 has a plurality of light-emitting elements 21, each including a luminescent layer 12 (organic luminescent layer) between the corresponding anode 10 and cathode 11 (a pair of electrodes); the element substrate 20A including pixel partition walls 13 separating the light-emitting elements 21 from each other; and a sealing substrate 31 opposing the element substrate 20A.

Element Substrate

As shown in FIG. 3, the base substrate 20 of the organic EL device 1 on which the above-described lines and devices, such as TFTs (not shown), are disposed is covered with an inorganic insulating layer 14 made of silicon nitride or the like. The inorganic insulating layer 14 has contact holes (not shown) through which each anode 10 is connected to the corresponding driving TFT 123. Planarizing layers 16 each containing a metal reflector 15 made of an aluminum alloy or the like are formed on the inorganic insulating layer 14.

Light-emitting elements 21 are formed on the planarizing layers 16. Each light-emitting element is defined by a luminescent layer 12 disposed between the anode 10 and the cathode 11. The light-emitting elements 21 are separated by the insulating pixel partition walls 13.

In the present embodiment, the anode 10 is made of an electroconductive metal oxide having a high work function of 5 eV or more and a high hole injection efficiency, such as ITO (indium tin oxide).

Since the organic EL device 1 of the present embodiment has a top emission structure, the anode 10 is not necessarily optically transparent and may be made of other metal, such as aluminum. In such a case, the metal reflector 15 may not be necessarily provided.

The cathode 11 must be optically transparent for the top emission structure and is accordingly made of an optically transparent material. ITO is a suitable electroconductive, optically transparent material, and indium zinc oxide (IZO), such as I Z O (registered trademark, developed by Idemitsu Kosan Co., Ltd.) may be used.

The cathode 11 is made of a material having a high electron injection efficiency (having a work function of 4 eV or less). Examples of such a material include calcium, magnesium, sodium, lithium, and compounds of these metals. The metal compounds include metal fluorides such as calcium fluoride, metal oxides such as lithium oxide, and organic metal complexes such as calcium acetylacetonate. However, these materials have high electrical resistance. Accordingly, the cathode may be formed by patterning a metal layer, such as of aluminum, gold, silver, or copper so as not to cover the light-emitting regions, or may be formed of a multilayer composite including an electroconductive, optically transparent metal oxide layer. In the present embodiment, the cathode 11 is made of a thin film of a composite of lithium fluoride, magnesium-silver alloy and ITO, having a thickness adjusted so as to be optically transparent.

The luminescent layer 12 is formed as a white luminescent layer emitting white light. The white luminescent layer is formed over the entire surface of the element substrate 20A by vacuum vapor deposition. White luminescent materials include a combination of a styrylamine compound and an anthracene dopant (blue) and a combination of a styrylamine compound and a rubrene dopant (yellow).

Preferably, a triarylamine (ATP) polymer hole injection layer, a triphenyldiamine (TDP) hole transport layer, and an aluminum quinolinol (Alq3) electron transport layer are provided over or under the luminescent layer 12.

The light-emitting elements 21 and the pixel partition walls 13 are covered with an electrode protection layer 17 (coating layer) over the element substrate 20A.

The electrode protection layer 17 is preferably made of a silicon compound, such as nitride silicate from the viewpoint of the optical transparency, adhesion, water resistance, and gas barrier property. The electrode protection layer 17 preferably has a thickness of 100 nm or less, but the thickness is preferably set to 200 nm or less from the viewpoint of preventing cracks caused by a stress resulting from the formation of the pixel partition walls 13.

While the electrode protection layer 17 in the present embodiment is a single layer, it may be constituted of a plurality of sub layers. The electrode protection layer 17 may include, for example, a low elastic modulus lower layer and a highly water-resistant upper layer.

The electrode protection layer 17 is covered with an organic buffer layer 18 (coating layer). The organic buffer layer 18 is formed so as to planarize the unevenness of the electrode protection layer 17 formed in association with the shape of the pixel partition walls 13 and is further formed so as to have a substantially even surface.

The organic buffer layer 18 reduces the stress produced by the warp or expansion of the element substrate 20A to prevent the electrode protection layer 17 from separating from the unstably shaped pixel partition walls 13. In addition, the substantially flat surface of the organic buffer layer 18 allows a hard gas barrier layer 19 (coating layer) to be formed evenly on the organic buffer layer 18. Thus, stress is not concentrated on a specific portion, and consequently cracks are prevented in the gas barrier layer 19.

The organic buffer layer 18 is made of a nonvolatile, easy-flow curable organic compound by screen printing under reduced pressure. The organic compound is all used for forming the skeleton of a polymer. Preferred is epoxy monomer/oligomer including an epoxy group having a molecular weight of 3,000 or less (monomer: having a molecular weight of 1,000 or less; oligomer: having a molecular weight of 1,000 to 3,000). Examples of such a compound include bisphenol A epoxy oligomers, bisphenol F epoxy oligomers, phenol novolak epoxy oligomers, polyethylene glycol diglycidyl ethers, alkyl glycidyl ethers, 3,4-epoxycyclohexenylmethyl-3',4'-epoxycyclohexene carboxylate, and $\epsilon$-caprolactone modified 3,4-epoxycyclohexylmethyl-3',4'-epoxycyclohexane carboxylate. These materials may be used singly or in combination.

The epoxy monomer/oligomer is cured by a reaction with a curing agent. The curing agent is desirably capable of forming electrically insulative, adhesive, heat-resistant, hard, strong cured coating. The curing agent is also preferably an optically transparent addition-polymerizable compound producing a cured material with a low variation. Examples of the curing agent include acid anhydride curing agents, such as 3-methyl-1,2,3,6-tetrahydrophthalic anhydride, methyl-3,6-endomethylene-1,2,3,6-tetrahydrophthalic anhydride, 1,2,4,5-benzenetetracarboxylic dianhydride, and 3,3',4,4'-benzophenonetetracarboxylic dianhydride. The reaction of the acid anhydride (ring opening reaction) can be promoted by adding a small amount of a nonvolatile high-molecular-weight alcohol, such as 1,6-hexane diol, or an amine compound, such as aminophenol compound as an accelerant. This allows the curing reaction to proceed easily at a low temperature. The curing reaction is performed at a temperature in the range of 60 to 100° C. The resulting cured coating has a polymer having ester bonds.

Although a cation polymerization initiator often used to shorten the curing time may be used, a slow-reaction polymerization initiator is preferred from the viewpoint of preventing the material from being rapidly shrunk by curing. Preferably, the cured layer is finally completed by heating so that the viscosity of the material is reduced by heating and thus the surface is flattened.

The material of the organic buffer layer may contain a silane coupling agent enhancing the adhesion with the electrode protection layer 17 or the gas barrier layer 19, a water scavenger such as an isocyanate compound, and other additives such as fine powder for preventing curing shrinkage. In order to form the organic buffer layer 18 by printing under reduced pressure, the water content in the curing material is be set at 100 ppm or less to reduce the occurrence of air bubbles.

Each of the materials preferably has a viscosity of 1,000 mPa·s or more (at room temperature, 25° C.). The viscosity in this range does not easily allow the material to permeate the luminescent layers 12 immediately after coating, and thus prevents the formation of dark spots from which light is not emitted. The mixture of the materials used for forming the organic buffer layer preferably has a viscosity of 500 to 20,000 mPa·s at room temperature, and particularly preferably 2,000 to 10,000 mPa·s at room temperature.

The organic buffer layer 18 preferably has a thickness of 2 to 5 μm. A thick organic buffer layer 18 can prevent a defect in the gas barrier layer 19 even if foreign matter is trapped. If the total thickness of the gas barrier layer 19 and the organic buffer layer 18 is increased to 5 μm or more, however, the distance between the color layers 37, described below, and the luminescent layers 12 is increased, thereby increasing the leakage of light to the sides. Consequently, the light extraction efficiency is reduced.

In addition, the organic buffer layer 18 preferably has an elastic modulus of 1 to 10 GPa. An organic buffer layer having an elastic modulus of 10 GPa or more cannot absorb the stress produced by flatten the layers overlying the pixel partition walls 13. In contrast, an organic buffer layer having an elastic modulus of 1 GPa or less does not have sufficient wear resistance or heat resistance.

The organic buffer layer 18 is covered with a gas barrier layer 19. The gas barrier layer 19 is formed wide so as to cover the organic buffer layer 18 and extend to the ends of the electrode protection layer 17.

The gas barrier layer 19 is intended to prevent the permeation of oxygen and water, and thus prevents oxygen or water from degrading the light-emitting elements 21. Preferably, the gas barrier layer 19 is made of silicon compound containing nitrogen, such as silicon nitride or nitride silicate, from the viewpoint of the optical transparency, gas barrier property, and water resistance.

The gas barrier layer 19 preferably has an elastic modulus of 100 GPa or more, and more specifically in the range of about 200 to 250 GPa. The gas barrier layer 19 preferably has a thickness of about 200 to 600 nm. A thickness of less than 200 nm leads to reduced protection from foreign matter and results in a through hole in the layer, thus losing the ability of gas barrier. A thickness of more than 600 nm may allow a stress to produce a crack.

The gas barrier layer 19 may has a multilayer structure, or the composition of the barrier layer material may be nonuniform so as to vary particularly the oxygen content gradually or in stages. When the barrier layer has a multilayer structure including a first gas barrier sub layer and a second gas barrier sub layer intended for protection from foreign matter, the first gas barrier sub layer preferably has a thickness of 200 to 400 nm. A first sub layer having a thickness of less than 200 nm cannot sufficiently cover the surface and sides of the organic buffer layer 18. The second gas barrier sub layer preferably has a thickness of 200 to 800 nm. A total thickness of 1,000 nm or more leads to an increased occurrence of crack and increased cost, and is thus disadvantageous.

Since in the present embodiment, the organic EL device 1 has a top emission structure, the gas barrier layer 19 must be optically transparent. Accordingly, the light transmittance of the visible light region is set at, for example, 80% or more by appropriately selecting or setting the material and thickness.

Sealing Substrate

A sealing substrate 31 is opposed to the element substrate 20A having the gas barrier layer 19.

Since the sealing substrate 31 has a surface through which light is extracted, it is made of an optically transparent material, for example, glass or a transparent plastic, such as polyethylene terephthalate, acrylic resin, polycarbonate, or polyolefin.

Color layers 37 including red color layers 37R, green color layers 37G, and blue color layers 37B are disposed in a matrix manner under the sealing substrate 31. Each color layer 37 is surrounded by a black matrix layer 32 (light-shielding layer). The color layers 37 have thicknesses in the range of about 0.1 to 1.5 μm for each color. The width of the color layer 37 is preferably in the range of about 10 to 15 μm.

The color layers 37 oppose the respective white luminescent layers 12 disposed on the anodes 10. Light generated by the luminescent layers 12 is transmitted across the respective color layers 37 and is emitted as red, green, and blue light to the observer.

In order to prevent light from leaking from the below-described frame zone (non-light emitting region) D (see FIG. 4) in the outer region of the organic EL device 1, the width of the outer region sealing layer 33 may be covered with the black matrix layer 32.

The organic EL device 1 thus displays color images with light emitted from the luminescent layers 12 through the color layers 37 for a plurality of colors.

In addition to the color layers 37, the sealing substrate 31 may include function layers, such as an ultraviolet light blocking or absorbing layer, an antireflection layer, and a heat sink layer.

In the present embodiment, the color layers 37 and the black matrix layer 32 are provided with a surface-modifying layer 40 over their surfaces to enhance the surface energy to the material of a below-described filling layer 34 so that the filling layer 34 can sufficiently fill the desired space.

The surface-modifying layer 40 is made of an organic compound having a polar functional group. Examples of such an organic compound include acrylic resins having a carbonyl or carboxyl group, styrylamine and ethyleneimine derivatives having a lot of amine groups, and organic silanes and organic titanates such as tetraethoxysilane, tetraethoxytitanate, and polysilazane.

The surface-modifying layer 40 is formed in all the pixel regions except the outer region of the sealing substrate 31 by patterning. The thickness of the surface-modifying layer 40 is smaller than that of the black matrix layer 32 and the color layers 37, and is preferably, for example, about 1 to 10 nm. The surface-modifying layer 40 has a high polarity, and may accordingly easily absorb water. The surface-modifying layer 40 is formed thin as much as possible to prevent the strength of the layer from being reduced by water absorption.

The surface energy (surface tension) of the surface-modifying layer 40 is 40 mN/m or more as a guide, and preferably 50 mN/m or more. This is because the liquid material of the below described filling layer 34, such as alicyclic epoxy monomer, has a viscosity of about 50 mPa·s (at room temperature), but has a high polarity so as to ensure reactivity for curing. Accordingly, the liquid material of the filling layer 34 has a high surface tension and is difficult to spread. Thus, the surface energy (surface tension) of the surface modifying layer 40 is preferably 40 mN/m or more.

An outer region sealing layer 33 is disposed in the outer region between the element substrate 20A and the sealing substrate 31.

The outer region sealing layer 33 enhances the accuracy of the alignment positions where the element substrate 20A and the sealing substrate 31 are bonded together, and acts as a bank preventing the filling layer 34 (adhesive layer) from extending to the outer region. The outer region sealing layer 33 is made of a material whose viscosity can be increased by ultraviolet light, such as epoxy. Preferably, the outer region sealing layer 33 is made of an epoxy monomer/oligomer including an epoxy group and having a molecular weight of 3,000 or less (monomer: having a molecular weight of 1,000 or less; oligomer: having a molecular weight of 1,000 to 3000). Examples of such a material include bisphenol A epoxy oligomers, bisphenol F epoxy oligomers, phenol novolak epoxy oligomers, polyethylene glycol diglycidyl ethers, alkyl glycidyl ethers, 3,4-epoxycyclohexenylmethyl-3',4'-epoxycyclohexene carboxylate, and s-caprolactone modified 3,4-epoxycyclohexylmethyl 3',4'-epoxycyclohexane carboxylate. These materials may be used singly or in combination.

The epoxy monomer/oligomer is cured by a reaction with a curing agent. The curing agent is preferably a cation polymerizable photoreactive initiator, such as a diazonium salt, a diphenyliodonium salt, a triphenylsulfonium salt, a sulfonic ester, an iron arene complex, and a silanol/aluminum complex. The viscosity of the material immediately after coating is preferably 20,000 to 200,000 mPa·s (at room temperature), and more preferably 40,000 to 100,000 mPa·s. A material that can gradually increase the viscosity after exposure to ultraviolet light allows the formation of the outer region sealing layer 33 with a sealing width as small as 1 mm or less without fracturing or spreading to the outer region. Preferably, the water content in the material is controlled to 1,000 ppm or less to reduce the occurrence of air bubbles when the pressure is reduced for bonding the two substrates together.

Preferably, the outer region sealing layer 33 has a thickness of 15 μm or less. Although adhesive generally contains a gap material (filler), such as clay minerals, silica balls, or resin balls, the UV-curable resin as the material of the outer region sealing layer 33 does not contain such fillers to prevent the gas barrier layer 19 from being damaged by pressure bonding.

A filling layer 34 (adhesive layer) made of a thermosetting resin is formed inside the outer region sealing layer 33 between the element substrate 20A and the sealing substrate 31.

The filling layer 34 fills the inside of the organic EL device 1 surrounded by the outer region sealing layer 33 without forming a void. The filling layer 34 secures the sealing substrate 31 opposing the element substrate 20A and buffers the luminescent layer 12 and the gas barrier layer 19 against external mechanical impact.

The filling layer 34 must be made of a curable fluid organic compound not containing a volatile constituent, such as an organic solvent. Preferably, the filling layer 34 is made of an epoxy monomer/oligomer including an epoxy group having a molecular weight of 3,000 or less (monomer: having a molecular weight of 1,000 or less; oligomer: having a molecular weight of 1,000 to 3,000). Examples of such a material include bisphenol A epoxy oligomers, bisphenol F epoxy oligomers, phenol novolak epoxy oligomers, polyethylene glycol diglycidyl ethers, alkyl glycidyl ethers, 3,4-epoxycyclohexenylmethyl-3',4'-epoxycyclohexene carboxylate, and ε-caprolactone modified 3,4-epoxycyclohexylmethyl 3',4'-epoxycyclohexane carboxylate. These materials may be used singly or in combination.

The epoxy monomer/oligomer is cured by a reaction with a curing agent. The curing agent is desirably electrically insulative, and is capable of forming a heat-resistant, strong cured coating. The curing agent is also preferably an optical transparent addition-polymerizable compound producing a cured material with a low variation. Examples of the curing agent include acid anhydride curing agents, such as 3-methyl-1,2,3,6-tetrahydrophthalic anhydride, methyl-3,6-endomethylene-1,2,3,6-tetrahydrophthalic anhydride, 1,2,4,5-benzenetetracarboxylic dianhydride, 3,3',4,4'-benzophenonetetracarboxylic dianhydride, and their polymers; and dicyandiamide. The material of the filling layer is cured at a temperature in the range of 60 to 100° C. The cured coating is a polymer having an ester bond enhancing adhesion with nitride silicate. The ring opening reaction of the acid anhydride can be promoted by adding a compound having a relatively high molecular weight, such as an aromatic amine or alcohol or an aminophenol. This allows the curing reaction to proceed at a low temperature in a short time. For the curing, an initiator, such as mercaptan, a tertiary amine catalyst, or a silane coupling agent may be used.

The material before being cured of the filling layer preferably has a viscosity of 500 mPa·s or less (at room temperature), and more preferably about 30 to 300 mPa·s from the viewpoint of sufficiently filling the space formed by bonding the substrates together. It is accordingly preferable that the material starts curing after the viscosity is reduced by heating. In addition, the water content in the material is controlled to 100 ppm or less to reduce the occurrence of air bubbles when the pressure is reduced for bonding the substrates.

Preferably, the filling layer 34 has a thickness of 1 to 5 μm. As with the outer region sealing layer 33, the material of the filling layer 34 does not contain a gap material (filler) generally contained in adhesive, such as clay minerals, silica balls, or resin balls, thus preventing the gas barrier layer 19 from being damaged.

The distance between the color layer 37 and the light-emitting elements 21 (interval between the substrates) is set so as to be smaller than the width of the black matrix layer 32 adjacent to the color layers 37. By setting the distance between the color layers 37 and the light-emitting elements 21 to this level, light emitted toward the adjacent pixels can be blocked by the black matrix layer 32 adjacent to the color layers 37.

Sectional Structure of Outer Region

Turning now to FIG. 4, the sectional structure of the outer region of the organic EL device 1 will now be described.

In outer region of the organic EL device 1, the electrode protection layer 17, the organic buffer layer 18, the gas barrier layer 19, and the outer region sealing layer 33 are formed in that order, as shown in FIG. 4, between the element substrate 20A and the sealing substrate 31.

The thickness of the organic buffer layer 18 is gradually reduced in the direction from the middle portion to the outer ends 35. This prevents damage to the gas barrier layer 19 covering the organic buffer layer 18, such as cracks or separation, resulting from stress concentration.

The gas barrier layer 19 is formed wider than the organic buffer layer 18 so as to cover the entire organic buffer layer 18, and the outer region sealing layer 33 is formed on the gas barrier layer 19. In addition, the rising points 36 of the outer ends 35 of the organic buffer layer 18 are located within the width d of the outer region sealing layer 33. The outer region sealing layer 33 thus protects the gas barrier layer 19 covering the outer ends 35 of the organic buffer layer 18 to prevent the gas barrier layer 19 from being damaged to crack or separate by stress concentration. Consequently, water is prevented from permeating the gas barrier layer 19 to reach the light-emitting elements 21, and thus dark spots can be prevented.

Although the gas barrier layer 19 extends beyond the periphery of the outer region sealing layer 33 in the present embodiment, it does not necessarily extend beyond the outer region sealing layer 33. The outer ends 39 of the gas barrier layer 19 may be located within the width d of the outer region sealing layer 33 as with the outer ends 35 of the organic buffer layer 18, as long as the gas barrier layer 19 extends beyond the outer ends 35 of the organic buffer layer 18. The electrode protection layer 17 is also formed wider than the organic buffer layer 18, and generally has the same width as the gas barrier layer 19 because it is formed through the same mask as the gas barrier layer 19.

The organic EL device 1 has a frame zone (non-light emitting region) D from which light is not emitted in the outer region. The frame zone is defined by, for example, the width from the end of the outermost pixel partition wall 13 on the element substrate 20A to the end of the element substrate 20A. For example, the frame zone D has a width of 2 mm while the outer region sealing layer has a width d of 1 mm.

In the present embodiment, the surface-modifying layer 40 is formed over the surfaces of the color layers 37 and the black matrix layer 32 to improve the surface energy to the liquid material of the filling layer 34, thereby allowing the filling layer 34 to be formed inside the outer region sealing layer 33 without forming a void. Thus, the adhesion performance of the filling layer 34 can be ensured so that the sealing substrate 31 and the element substrate 20A are secured to each other with the filling layer 34 and the outer region sealing layer 33 in between.

The surface-modifying layer 40 has a smaller thickness than the color layers 37 and the black matrix layer 32 so as to reduce the absorption of water and other fluid and thus to ensure a desire strength. If the surface-modifying layer 40 has a large thickness, the surface-modifying layer 40 may absorb the curing agent contained in the materials of the filling layer 34 and the outer region sealing layer 33 to hinder the materials from being cured. By reducing the thickness of the surface-modifying layer 40 to smaller than that of the color layer 37 and the black matrix layer 32, the absorption of the curing agent can be reduced. Accordingly, the filling layer 34 can be favorably cured and, thus, the adhesion performance of the filling layer 34 can be ensured.

The surface-modifying layer 40 is formed by patterning within the pixel region, but not the outer region, of the sealing substrate 31. Consequently, the outer region sealing layer 33 is not broken by contact with the liquid material of the filling layer 34, thus ensuring the function as a bank.

The outer region sealing layer 33 is disposed on the gas barrier layer 19. This reduces the frame zone D more than that in the structure in which the outer region sealing layer 33 is disposed outside the gas barrier layer, and achieves superior heat resistance and moisture resistance.

General sealing materials contain inorganic particles to increase the viscosity so as to prevent the degradation of the sealing ability. On the other hand, the outer region sealing layer 33 of the embodiment is made of a material whose viscosity is gradually increased by ultraviolet light exposure. Thus, the viscosity of the material is increased by ultraviolet light exposure before bonding the element substrate 20A and the sealing substrate 31 together. Consequently, the sealing ability can be maintained after bonding under reduced pressure while the image forming speed is kept high with a dispenser.

Furthermore, the thermosetting resin filling layer 34 is disposed inside the outer region sealing layer 33 between the element substrate 20A and the sealing substrate 31, so that the adhesion between the element substrate 20A and the sealing substrate 31 is enhanced while the gas barrier layer 19 and its underlying function layers are prevented from being affected by curing shrinkage. Consequently, water can be prevented from permeating the inside surrounded by the outer region sealing layer 33 between the element substrate 20A and the sealing substrate 31. The outer region sealing layer 33 also buffers the luminescent layer 12 and the gas barrier layer 19 against external mechanical impact.

In addition, the gas barrier layer 19 is made of a silicon compound. Consequently, the optical transparency, gas barrier property, and water resistance can be ensured.

Method for Manufacturing Organic EL Device

Figure 5A:
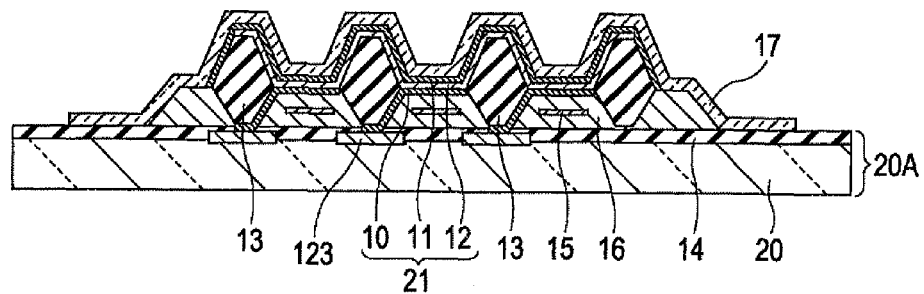
FIGS. 5A to 5C are representations of a process for preparing the element substrate of the organic EL device according to the first embodiment.
Figure 5B:
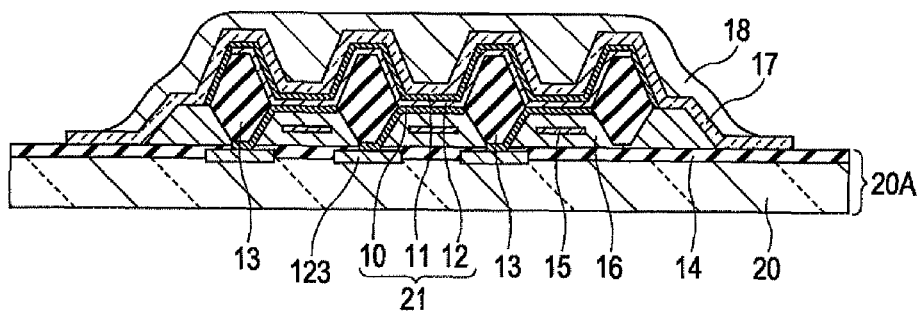
Figure 5C:
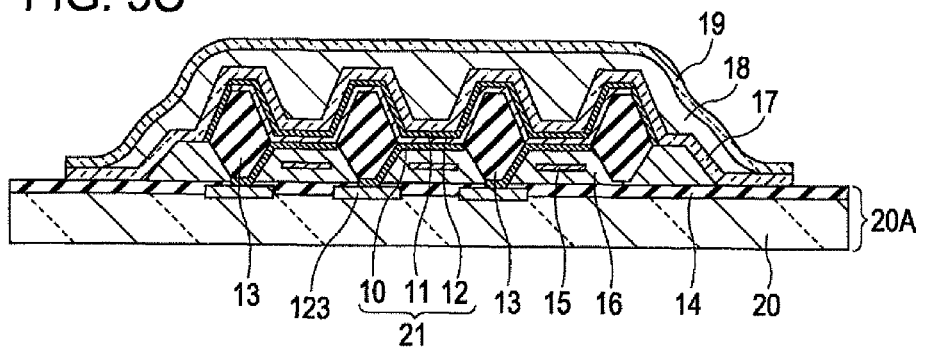

A method for manufacturing the organic EL device 1 of the embodiment will now be described with reference to FIGS. 5A to 5C and 6A to 6E. FIGS. 5A to 5C are representations illustrating a process for preparing an assembly of the element substrate 20A of the organic EL device 1, and FIGS. 6A to 6E are representations illustrating a process for preparing an assembly of the sealing substrate 31.

The electrode protection layer 17 is formed over the element substrate 20A on which layers up to the cathode 11 have been deposited, as shown in FIG. 5A.

More specifically, the electrode protection layer 17 is formed of, for example, silicon compound containing nitrogen, such as silicon nitride or nitride silicate, by a high-density plasma deposition, such as ECR sputtering or ion plating.

Then, the organic buffer layer 18 is formed over the electrode protection layer 17, as shown in FIG. 5B.

More specifically, an organic buffer layer material is printed under reduced pressure, followed by heating at a temperature in the range of 60 to 100° C. Undesirably, the viscosity of the material is temporality reduced immediately after heating until starting a reaction. At this point, the material of the organic buffer layer 18 permeates the luminescent layers 12 made of, for example, $Alp_3$, through the electrode protection layer 17 and the cathode 11 to form dark spots. It is therefore preferable that the deposit of the material be allowed to stand at a low temperature until being hardened to some extent, and then heated to cure completely when the viscosity is increased to some extent.

Then, the gas barrier layer 19 is formed over the organic buffer layer 18, as shown in FIG. 5C.

More specifically, a high density deposition can be applied, such as ECR sputtering or ion plating. Before deposition, oxygen plasma treatment may be performed to enhance the adhesion and thus to enhance the reliability.

Figure 6A:
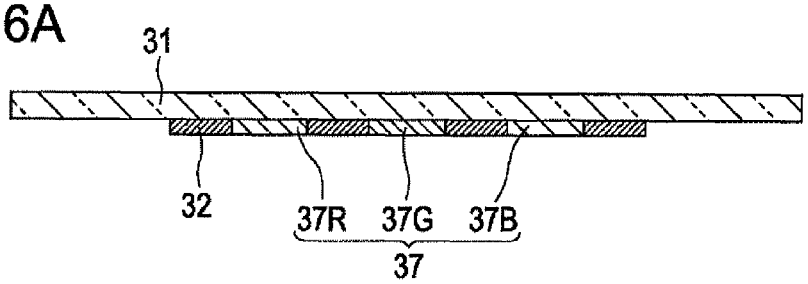
FIGS. 6A to 6E are representations of a process for preparing the sealing substrate of the organic EL device according to the first embodiment.

Turning now to FIG. 6A, the color layers 37 and the black matrix layer 32 are formed on the sealing substrate 31. Red color layers 37R, green color layers 37G, and blue color layers 37B are formed in a matrix manner as the color layers 37, and the black matrix layer 32 is formed so as to surround each of the color layers 37R, 37G, and 37B.

More specifically, the color layers 37R, 37G, and 37B are opposed to the while luminescent layers 12 disposed on the respective anodes 10. The thickness of the color layers 37 is desirably thin as much as possible in view of the light transmittance, and each of the red color layers 37R, the green color layers 37G, and blue color layers 37B is formed to a thickness of about 0.1 to 1.5 μm.

The black matrix layer 32 is formed to a thickness substantially equal to or more than the thickness of the color layers 37.

More specifically, the black matrix layer is pattered by a printing process, such as photolithography or ink jet method while the amount of the material to be applied is adjusted to control the thickness appropriately.

Figure 6B:
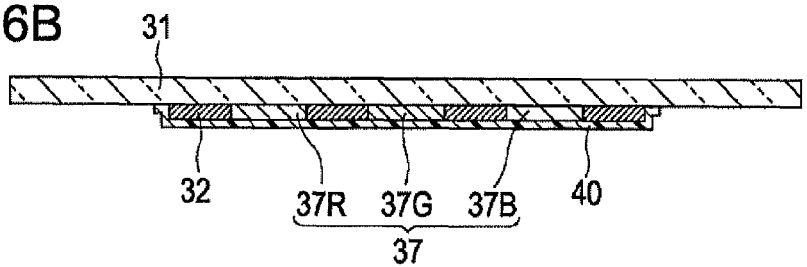

Subsequently, the surface-modifying layer 40 is formed in the pixel regions so as to cover the color layers 37 and the black matrix layer 32, as shown in FIG. 6B.

More specifically, the material of the surface-modifying layer 40 is diluted with a raw material constituent or an organic solvent and is applied in a pattern in the pixel regions by printing, such as flexography, gravure printing, slit coating, or screen printing, followed by vaporizing and curing in a heat oven or the like. Thus, the surface-modifying layer 40 is formed of an organic compound.

Figure 6C:
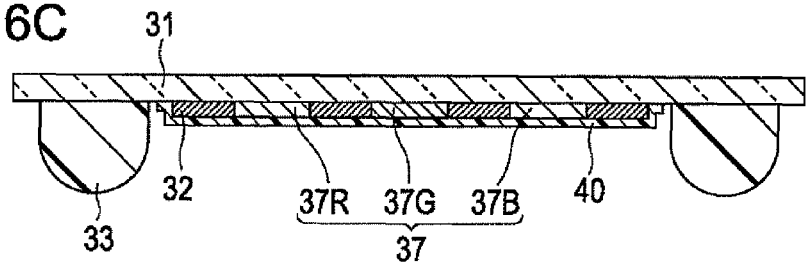

The outer region sealing layer 33 is formed in the outer region of the sealing substrate 31 on which the color layers 37, the black matrix layer 32, and the surface-modifying layer 40 have been formed, as shown in FIG. 6C.

More specifically, an UV-curable resin material (liquid material) is applied in the outer region of the sealing substrate 31 by a needle dispensing technique.

Alternatively, the UV-curable resin may be applied by screen printing.

Figure 6D:
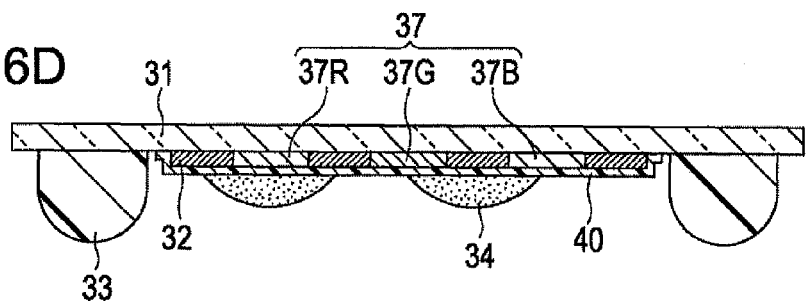

Then, the filling layer 34 is formed inside the outer region sealing layer 33 on the sealing substrate 31, as shown in FIG. 6D.

More specifically, a thermosetting resin material is applied by a jet dispensing technique.

The thermosetting rein material is not necessarily applied over the entire surface of the sealing substrate 31, and may be applied at several areas on the sealing substrate 31.

Figure 6E:
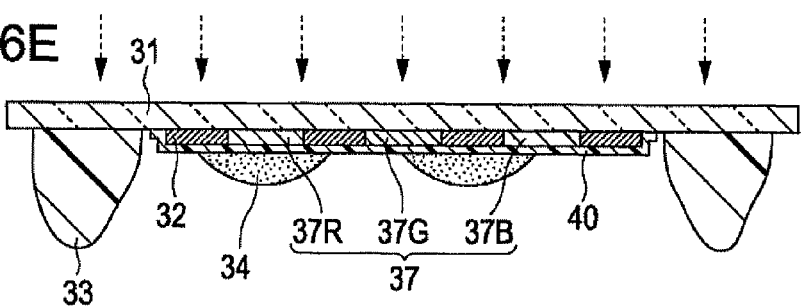

Then, the sealing substrate 31 on which the materials of the outer region sealing layer 33 and the filling layer 34 have been applied is exposed to ultraviolet light, as shown in FIG. 6E.

More specifically, the sealing substrate 31 is exposed to ultraviolet light of, for example, 30 mW/cm$^2$ in illumination and 500 mJ/cm$^2$ in light quantity to induce the curing reaction of the material of the outer region sealing layer 33. At this point, only the UV-curable resin of the outer region sealing layer 33 reacts to increase the viscosity gradually.

Then, the element substrate 20A having the layers up to the gas barrier layer 19 shown in FIG. 5C is bonded to the sealing substrate 31 on which the material of the outer region sealing layer 33 has started to be cured as shown in FIG. 6E. For the bonding, the element substrate 20A and the sealing substrate 31 are brought close to each other while the alignment positions are finely adjusted.

More specifically, the opposing positions of the light-emitting elements 21 and the color layers 37 are adjusted so that the light-emitting elements 21 are aligned with the color layers 37 by relatively moving the element substrate 20A and the sealing substrate 31 in the surface direction (parallel to each other). For example, the light-emitting elements 21 and the color layers 37 are opposed within a misalignment of 2 µm, thus being finally adjusted (corrected) in position.

Then, the outer region sealing layer 33 is formed so as to fully cover the rising points 36 of the outer ends 35 of the organic buffer layer 18 on the element substrate 20A.

Thus, the substrates are pressure-bonded together by being allowed to stand in a vacuum atmosphere at a vacuum of 1 Pa under an increased pressure of 600 N for 200 seconds while the alignment positions are adjusted.

The bonded assemblies of the substrates are heated together in a normal atmosphere.

More specifically, the assembly of the element substrate 20A and the sealing substrate 31 bonded together are heated in a normal atmosphere at a temperature of about 60 to 100° C. to cure the material of the outer region sealing layer 33 started to be cured in the foregoing step and the material of the filling layer 34. The filling layer 34 is intended to protect the gas barrier layer 19. If the filling layer 34 is kept liquid, the liquid filling layer 34 may convect in the device under high-temperature conditions, thereby damaging the gas barrier layer 19. Therefore, the filling layer 34 must be solidified.

Even if a vacuum space is present between the element substrate 20A and the sealing substrate 31, the space can be filled with the filling layer 34 by heat curing in a normal atmosphere. The organic EL device 1 of the present embodiment is thus produced as desired.

In the above-described method, the surface-modifying layer 40 improving the surface energy to the liquid material of the filling layer 34 is formed over the surfaces of the color layers 37 and the black matrix layer 32. The surface-modifying layer 40 acts as the contact surface with the material of the filling layer 34 to reduce their contact angle. Consequently, a reduced amount of the filling layer material can sufficiently fill the desired space in a shorter time. The surface-modifying layer 40 allows the use of an adhesive having a high surface tension and a low fluidity.

If the surface-modifying layer 40 is formed over the surfaces of the color layers 37 and the black matrix layer 32 so as to cover the boundaries between the color layers 37 and the black matrix layer 32, the liquid material of the filling layer 34 can be rapidly spread to the steps at the boundaries between the color layers 37R, 37G, and 37B and the black matrix layer 32. Thus, the material of the filling layer 34 fills the inner space without trapping air bubbles.

In addition, the heights of the color layers 37 and the black matrix layer 32 can be evened to form a smooth surface, depending on the height of the steps.

In any case, the material of the filling layer 34 can be rapidly spread over the surface of the surface-modifying layer 40, and accordingly, the material can fill the inner space sufficiently. Thus, the capability of the liquid material of the filling layer 34 to fill the space is enhanced even though an overcoat layer is not provided for planarizing the surfaces of the color layers 37 and the black matrix layer 32. Since the overcoat layer is not required, the distance between the element substrate 20A and the sealing substrate 31 (distance between the luminescent layers 12 and the color layers 37) can be reduced.

Since the liquid material of the filling layer 34 can sufficiently fill the inner space, the surface-modifying layer 40 can be formed thin on the color layers 37 and the black matrix layer 32. Accordingly, the distance between the element substrate 20A and the sealing substrate 31 (distance between the luminescent layers 12 and the color layers 37) can further be reduced.

Consequently, emitted light does not leak to the adjacent pixels even if the pitch of the pixels is reduced while the area of the color layers 37 (pixel area) is increased in order to increase the viewing angle. Since the emitting area is thus increased, highly bright light can be emitted with low power consumption. Also, the thickness of the device can be reduced as a whole.

The material of the outer region sealing layer 33 is exposed to ultraviolet light to induce a curing reaction before bonding the element substrate 20A and the sealing substrate 31 together. When the viscosity of the outer region sealing layer 33 starts increasing, the element substrate 20A and the sealing substrate 31 are bonded together. Since the material has a low viscosity when it is applied, fast drawing can be performed. Since the material has a high viscosity when the substrates are bonded, the bonding positions can be aligned accurately and the filling layer 34 can be prevented from extending to the outer region.

After bonding the element substrate 20A and the sealing substrate 31, the outer region sealing layer 33 and the filling layer 34 are cured by heating, so that the adhesion, heat resistance, and moisture resistance can be enhanced while the positional accuracy is maintained. Also, the element substrate 20A and the sealing substrate 31 are bonded together under reduced pressure and cured in a normal atmosphere, so that a difference in pressure is produced between atmospheres of vacuum and air. Consequently, the material of the filling layer 34 can spread over inside the outer region sealing layer 33 without forming a void, thus preventing air bubbles or water from being trapped.

As described above, by protecting the gas barrier layer 19, the deterioration of the light-emitting elements 21 can be prevented. Thus, a highly heat-resistant, highly reliable organic EL device 1 can be achieved.

Second Embodiment of Organic EL Device

Figure 7:
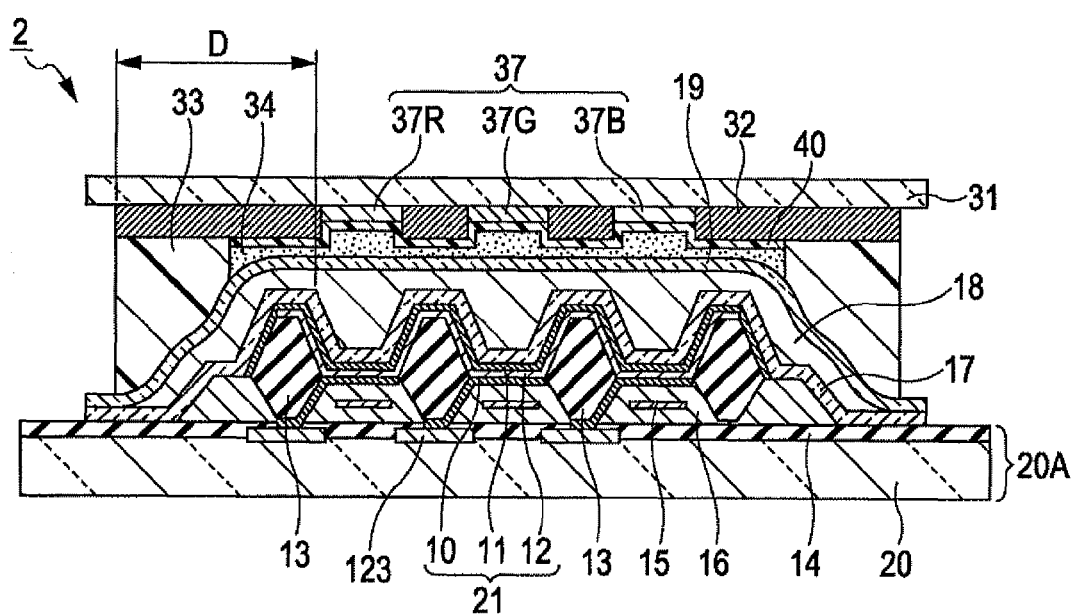
FIG. 7 is a schematic sectional view of an organic EL device according to a second embodiment of the invention.

Another organic EL device 2 will now be described according to a second embodiment. The same parts in the drawings of the present embodiment are designated by the same reference numerals as in the first embodiment, and the same description is omitted. FIG. 7 is a schematic sectional view of the organic EL device 2.

The organic EL device 2 of the second embodiment is different from the organic EL device 1 of the first embodiment in that the black matrix layer 32 covers the outer region of the sealing substrate 31 corresponding to the width of the outer region sealing layer 33 in order to prevent light from leaking through the frame zone (non-light emitting region) D in the outer region of the device, and that the color layers 37 have a larger thickness than the black matrix layer 32.

By covering the outer region of the sealing substrate 31 corresponding to the width of the outer region sealing layer 33 with the black matrix layer 32 as shown in FIG. 7, light can be prevented from leaking through the frame zone (non-light emitting region) D in the outer region of the organic EL device 2. In addition, by forming the black matrix layer 32 thicker than the color layers 37, light can be prevented from leaking to the adjacent pixels. The black matrix layer 32 preferably has a thickness of about 1 to 2 μm. In order to form the black matrix layer 32 having a larger thickness than the color layers 37, the black matrix layer 32 is formed after the formation of the color layers 37.

The surface-modifying layer 40 covers the surfaces of the color layers 37 and the black matrix layer 32 in the pixel regions.

More specifically, the surface-modifying layer 40 is patterned so that the surface of the black matrix layer 32 except the light emitting regions (pixel regions) is partially exposed. In other words, the surface-modifying layer 40 does not cover the region (contact portion) of the black matrix layer 32 on which the outer region sealing layer 33 is to be formed. Consequently, the outer region sealing layer 33 formed on the black matrix layer 32 is not broken, thus ensuring the function as a bank.

The surface-modifying layer 40 allows the liquid material of the filling layer 34 to spread to and permeate the steps at the boundaries between the color layers 37 and the black matrix layer 32. Thus, the liquid material can fill the inner space without air bubbles trapped in the steps. Also, the liquid material of the filling layer 34 can rapidly spread to the steps, and accordingly, the filling time can be reduced. Since the filling layer material can spread favorably and fill the space in a short time, the amount of the filling layer material can be reduced so that the thickness of the filling layer 34 is reduced.

Electronic Apparatus

Electronic apparatuses including the organic EL device according to either of the embodiments will now be described.

Figure 8A:
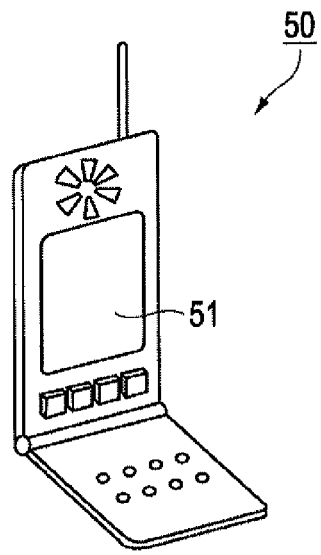
FIGS. 8A to 8C are perspective views of electronic apparatuses according to embodiments of the invention.

FIG. 8A is a perspective view of a cellular phone according to an embodiment of the invention. The cellular phone 50 shown in FIG. 5A includes a display 51 including the organic EL device.

Figure 8B:
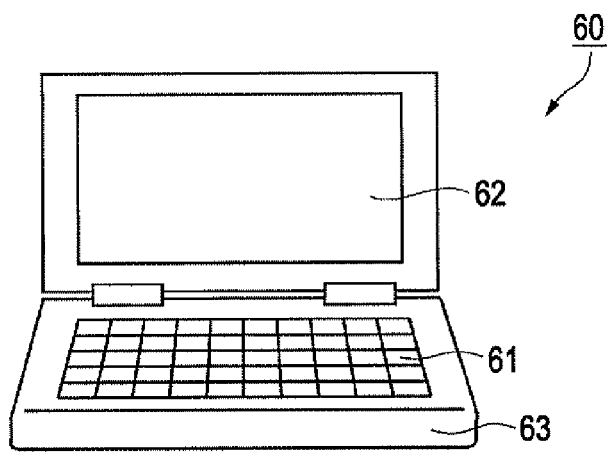

FIG. 8B is a perspective view of a mobile information processing apparatus, such as a word processor or a personal computer. The information processing apparatus 60 shown in FIG. 8B includes an input section 61, such as a key board, a body 63, and a display 62 including the organic EL device.

Figure 8C:
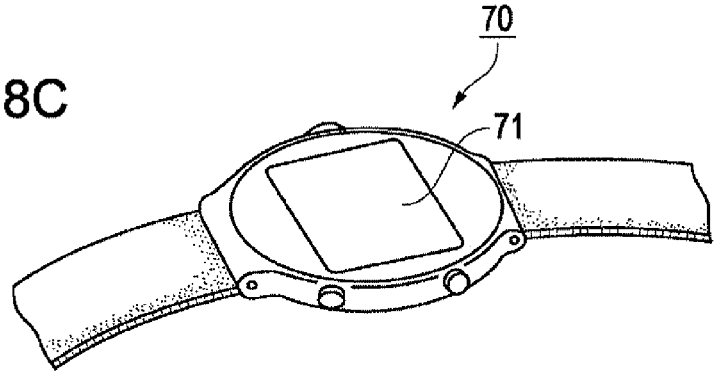

FIG. 8C is a perspective view of a wristwatch-type electronic apparatus. The wristwatch-type electronic apparatus 70 shown in FIG. 5C includes an EL display 71 including an organic EL device Since the electronic apparatuses shown in FIGS. 8A to 8C each include the organic EL device according to any one of the embodiments, satisfying display performance can be achieved.

The organic EL device can be used in a variety of electronic apparatuses including desktop computers, liquid crystal projectors, multimedia personal computers (PC's), engineering work stations (EWS's), pagers, word processors, television sets, viewfinder-type or monitor-direct-view-type video tape recorders, electronic notebooks, electronic calculators, car navigation systems, POS terminals, and touch panel-including apparatuses without being limited to the above-described apparatuses.

While the invention has been described with reference to preferred embodiments and attached drawings, the invention is not limited to those embodiments, and the embodiments may be combined. It will be readily appreciated by those skilled in the art that various modifications may be made without departing from the scope and spirit of the invention defined in and by the appended claims, and that the scope of the invention encompasses such modifications.

For example, while the surface-modifying layer 40 is formed by coating in the above embodiments, an oxygen-rich layer (organic compound layer) whose molecule contains many carbonyl groups, carboxyl groups, or the like may be formed by vapor deposition in a plasma atmosphere of a mixture of argon gas and oxygen gas under reduced pressure. A thin layer of an oxide semiconductor, such as zinc oxide (ZnO) or titanium oxide ($TiO_2$), may be patterned in the pixel regions (on the surfaces of the color layers 37 and the black matrix layer 32) by vacuum vapor deposition, sputtering, or the like.

In this instance, it is preferable that the thin layer be subjected to after treatment to increase the surface energy by, for example, ultraviolet light exposure.

The entire disclosure of Japanese Patent application No. 2007-213366, field Aug. 20, 2007 is expressly incorporated by reference herein.

What is claimed is:

1. An organic electroluminescent device comprising:
   an element substrate including a plurality of light-emitting elements, each including a pair of electrodes with an organic luminescent layer therebetween, and a coating layer covering the light-emitting elements;
   a sealing substrate opposing the element substrate, the sealing substrate including a plurality of color layers and a light-shielding layer separating the color layers from each other;
   an outer region sealing layer bonding the outer region of the sealing substrate to the outer region of the element substrate; and
   a filling layer surrounded by the outer region sealing layer, the filling layer bonding the sealing substrate and the element substrate together in the region in which the light-emitting elements and the color layers are arranged;
   wherein the color layers and the light-shielding layer of the sealing substrate are covered with a surface-modifying layer made of a material having a higher surface energy to the material of the filling layer than the surface energy to the surfaces of the color layers and light-shielding layer.

2. The organic electroluminescent device according to claim 1, wherein the surface-modifying layer has a smaller thickness than the color layers and the light-shielding layer.

3. The organic electroluminescent device according to claim 1, wherein the filling layer is made of a material having a lower viscosity than the material of the outer region sealing layer.

4. The organic electroluminescent device according to claim 1, wherein the surface-modifying layer is patterned so as to expose an outer region of the sealing substrate.

5. The organic electroluminescent device according to claim 1, wherein the light-shielding layer is further provided in an outer region of the sealing substrate from which light is not emitted, and the surface-modifying layer is patterned so as to expose part of the region of the light-shielding layer in contact with the outer region sealing layer.

6. The organic electroluminescent device according to claim 1, wherein the coating layer includes an electrode protection layer covering the electrodes of the light-emitting elements, an organic buffer layer covering the electrode protection layer, and a gas barrier layer covering the organic buffer layer, and the light-shielding layer is made of a material having a lower elastic modulus than the elastic moduli of the organic buffer layer and the gas barrier layer.

7. A method for manufacturing an organic electroluminescent device comprising:
   forming a surface-modifying layer covering a plurality of color layers and a light-shielding layer on a sealing substrate;
   forming a coating layer covering a plurality of light-emitting elements over an element substrate, each light-emitting element including an organic luminescent layer between a pair of electrodes; and
   bonding the element substrate and the sealing substrate together with an outer region sealing layer and a filling layer therebetween,
   wherein the surface-modifying layer has a higher surface energy to the material of the filling layer than the surface energy to the surfaces of the color layers and the light-shielding layer.

8. The method according to claim 7, wherein bonding the element substrate and the sealing substrate together includes: forming the outer region sealing layer by applying an UV-curable resin to an outer region of the sealing substrate; and forming the filling layer by applying a thermosetting resin inside the outer region sealing layer.

9. The method according to claim 8, wherein the element substrate and the sealing substrate are bonded together under reduced pressure after the UV-curable resin of the outer region sealing layer starts a curing reaction.

10. An electronic apparatus comprising the organic electroluminescent device as set forth in claim 1.

* * * * *